| United States Patent [19] | [11] Patent Number: 4,904,571 |
| --- | --- |
| Miyashita et al. | [45] Date of Patent: Feb. 27, 1990 |

[54] REMOVER SOLUTION FOR PHOTORESIST

[75] Inventors: Tsuyoshi Miyashita, Fujisawa; Shigeru Ohtawa, Yamato; Hiroyuki Tohda, Yokohama; Shozo Toda, Chigasaki; Hisashi Nakane, Yokohama, all of Japan

[73] Assignee: Tokyo Ohka Kogyo Co., Ltd., Kawasaki, Japan

[21] Appl. No.: 219,638

[22] Filed: Jul. 15, 1988

[30] Foreign Application Priority Data

Jul. 21, 1987 [JP] Japan .................... 62-180013

[51] Int. Cl.$^4$ ............ G03C 1/74; G03C 5/16
[52] U.S. Cl. .................. 430/331; 430/329; 252/158; 252/139; 427/96
[58] Field of Search ........... 430/329, 381; 252/158, 252/139; 427/96

[56] References Cited

U.S. PATENT DOCUMENTS 4,517,227 11/1982 Cassat .................... 430/167
4,761,303 11/1986 Ruszezyk et al. ............. 427/305

Primary Examiner—Paul R. Michl
Assistant Examiner—Thorl Chea
Attorney, Agent, or Firm—Armstrong, Nikaido, Marmelstein, Kubovcik & Murray

[57] ABSTRACT

A remover solution for photoresist comprising (a) a solvent which is typically water, (b) an inorganic or organic alkaline compound such as sodium and potassium hydroxides, and (c) a borohydride compound such as sodium and lithium borohydrides and organic amine borane compounds. When used for removing patterned photoresist layer in the manufacturing process of, for example, electronic circuit board substrates. The method gives quite satisfactory results without discoloration or denaturation of the copper surface and solder surface, consequently leading to the production of high-quality products.

10 Claims, No Drawings

REMOVER SOLUTION FOR PHOTORESIST

BACKGROUND OF THE INVENTION

The present invention relates to a remover solution for photoresist or, more particularly, to a remover solution for a photoresist composition developable by use of a weakly alkaline developer solution and used in the manufacturing process of printed circuit boards.

Among the various processes for the manufacture of printed circuit boards, the most widely practiced in the art are the so-called copper through-hole method and the solder throughhole method.

The copper through-hole method includes a step of etching treatment by utilizing a patterned photoresist layer as an etching mask formed on a copper-foiled laminated plate having one or more of copper-plated through-holes. The photoresist layer is removed after completion of the etching treatment. In the solder through-hole method, the patterned photoresist layer is also removed after plating with a solder alloy utilizing a patterned photoresist layer as a plating mask.

As is well known, a variety of photoresist compositions are used currently for the manufacture of printed circuit boards, of which the most widely used are liquid photoresist compositions and dry film-type photoresist compositions capable of being developed by use of a weakly alkaline developer solution in view of the general advantageousness including easiness in the patterning works and disposal of waste solutions.

As is mentioned above, the patterned photoresist layer is always removed after completion of the etching treatment in the copper through-hole method and after completion of the plating treatment in the solder through-hole method. It is usual that the photoresist layer is removed by using an aqueous solution of potassium hydroxide or sodium hydroxide as a remover solution. Such a remover solution conventionally used in the prior art has several problems and disadvantages. When the removing treatment is performed by dipping the laminated plate in the remover solution, for example, discoloration or denaturation takes place in the copper surface on the laminated plate so that the subsequent treatments may be adversely influenced or the ingredient of tin containined in the solder alloy of the plating layer may be dissolved in the remover solution eventually resulting in an increase in the melting temperature of the solder alloy forming the plating layer. Since the layer of the solder alloy serves as a protecting film of the coppermade wiring by covering the copper wiring when it is melted at a temperature of around 240° C. at which no adverse influences are caused in the printed circuit board, the protecting film can no longer be formed when the melting temperature of the solder alloy is increased. Since the solder plating layer around the through-holes serves to fix various kinds of parts and devices to the printed circuit board by melting when it is heated at or above a certain temperature, the parts and devices can no longer mounted on and fixed to the circuit board when the melting temperature of the solder alloy is unduly increased.

SUMMARY OF THE INVENTION

The present invention accordingly has an object to provide a novel and improved remover solution for photoresist free from the above described problems and disadvantages in the prior art remover solutions.

The inventors have undertaken extensive investigations in order to solve the above mentioned object and unexpectedly arrived at a discovery that the problems in the prior art can be solved by adding a specific additive compound to an alkaline solution such as an aqueous solution of sodium hydroxide, potassium hydroxide and the like leading to completion of the present invention.

Thus, the remover solution provided by the present invention comprises, in admixture:

(a) a solvent;
(b) an alkaline compound dissolved in the solvent; and
(c) a borohydride compound dissolved in the solvent.

DETAILED DESCRIPTION OF THE PREFERRED EMBODIMENTS

As is described above, the most characteristic feature of the inventive remover solution is the admixture of a specific borohydride compound to an alkaline solution of which the solvent is water, an organic solvent or a mixture thereof.

The alkaline compound used as the component (b) in the inventive remover solution may be an inorganic or organic basic compound soluble in the solvent. Examples of suitable inorganic alkaline compounds include alkali hydroxides such as potassium hydroxide, sodium hydroxide, lithium hydroxide and the like, alkali carbonates such as potassium carbonate, sodium carbonate, lithium carbonate, potassium hydrogen carbonate, sodium hydrogen carbonate, lithium hydrogen carbonate and the like, alkali phosphates such as potassium phosphate, sodium phosphate and the like, alkali pyrophosphates such as potassium pyrophosphate, sodium pyrophosphate and the like, and so on.

Examples of suitable organic alkaline compounds include primary amines such as benzyl amine, butyl amine and the like, secondary amines such as dimethyl amine, benzyl methyl amine, diethanol amine and the like, tertiary amines such as trimethyl amine, triethyl amine, triethanol amine and the like, cyclic amines such as morpholine, piperazine, piperidine, pyridine and the like, polyamines such as ethylene diamine, hexamethylene diamine and the like, quaternary ammonium hydroxides such as tetramethyl ammonium hydroxide, tetraethyl ammonium hydroxide, trimethyl benzyl ammonium hydroxide, trimethyl phenyl ammonium hydroxide and the like, sulfonium hydroxides such as trimethyl sulfonium hydroxide, diethyl methyl sulfonium hydroxide, dimethyl benzyl sulfonium hydroxide and the like, and so on.

The solvent as the component (a) in the inventive remover solution to dissolve the above described inorganic or organic alkaline compound can be water, an organic solvent or a mixture thereof. Examples of suitable organic solvents include alcohols such as methyl alcohol, ethyl alcohol, propyl alcohol, ethylene glycol and the like, ether compounds such as ethylene glycol monoethyl ether, ethylene glycol monobutyl ether and the like, ketones such as acetone, methyl ethyl ketone and the like, chlorinated hydrocarbon compounds such as 1,1,1-trichloroethane and the like and aromatic hydrocarbon compounds such as benzene, toluene, xylene and the like. These solvents including water can be used either singly or as a mixture of two kinds or more. It is preferable that the solvent is water or an aqueous mixed solvent mainly composed of water in view of the cost and the problems encountered in the disposal of waste solutions. The concentration of the inorganic or organic alkaline compound dissolved in the solvent is preferably in the range from 0.1 to 10% by weight although the exact concentration should be adequately selected by taking the type of the photoresist composition to be removed and the influence of the alkali on the copper surface on the substrate laminate into consideration.

The borohydride compound as the characteristic ingredient in the inventive remover solution is exemplified by sodium borohydride $NaBH_4$, lithium borohydride $LiBH_4$, dimethyl amine borane $(CH_3)_2NH:BH_3$, trimethyl amine borane $(CH_3)_3N:BH_3$, pyridine borane $C_5H_5N:BH_3$, tert-butyl amine borane $(CH_3)_3CHN_2:BH_3$, triethyl amine borane $(C_2H_5)_3N:BH_3$, morpholine borane $O(CH_2CH_2)_2NH:BH_3$ and the like. These borohydride compounds can be used either singly or as a combination of two kinds or more according to need.

The amount of the borohydride compound in the inventive remover solution is preferably in the range from 0.01 to 50 moles per mole of the inorganic or organic alkaline compound. When the amount thereof is too small, the desired effect by the addition thereof cannot be exhibited as a matter of course. When the amount thereof is too large, on the other hand, the removing activity of the remover solution is somewhat decreased resulting in an increase in the length of time taken for complete removal of the photoresist layer using the remover solution.

The remover solution of the present invention is applicable to any types of photoresist compositions provided that the photoresist composition is developable by using a weakly alkaline developer solution The photoresist composition can be of the dry film type or of the coating solution type. The photoresist composition can be prepared by uniformly blending a copolymer of one or more of the monomers selected from the group consisting of methyl methacrylate, ethyl acrylate, ethyl methacrylate, butyl acrylate, butyl methacrylate, 2-hydroxyethyl acrylate, 2-hydroxyethyl methacrylate, 2-hydroxypropyl acrylate, 2-hydroxypropyl methacrylate, glycidyl acrylate, glycidyl methacrylate, acrylamide, methacrylamide and the like and a carboxyl group-containing monomer copolymerizable with the above named monomers such as acrylic acid, methacrylic acid and the like, a photopolymerizable monomer such as trimethylol propane triacrylate, trimethylol propane trimethacrylate, tetraethylene glycol diacrylate, tetraethylene glycol dimethacrylate and the like and a photopolymerization initiator such as anthraquinone, 2-methyl anthraquinone, benzophenone, benzoin and the like though not particularly limited thereto. A dry film type photoresist composition can be prepared by shaping the above described composition into a film-like form. A coating solution type photoresist composition can be prepared by dissolving the above described composition in a suitable organic solvent such as methyl ethyl ketone, ethyl acetate, toluene and the like.

A typical procedure for the removing treatment of a patterned photoresist layer is as follows. Thus, a copper-foiled laminated substrate provided with a patterned photoresist layer is subjected to a treatment of etching or plating and then immersed in the inventive remover solution to remove the photoresist layer. The remover solution is kept at a temperature in the range from 20 to 60° C. and the substrate is immersed in the solution for 2 to 60 minutes. After completion of the removing treatment, the substrate is washed with water and dried. Substrates of the solder through-hole type are further subjected to a treatment of copper etching and provided with a protecting film on the surface before the substrate is transferred to the mounting process.

In the following, examples are given to illustrate the present invention in more detail.

EXAMPLE 1

A photopolymerizable composition was prepared by uniformly mixing:

100 parts by weight of a copolymer of methyl methacrylate, ethyl acrylate, methacrylic acid and 2-methacryloxyethyl succinate $(CH_2=C(CH_3)-CO-O-CH_2CH_2-O-CO-CH_2CH_2-COOH)$ in a weight ratio of 40:20:10:30 having an average molecular weight of about 50,000;

15 parts by weight of trimethylol propane triacrylate;

20 parts by weight of tetraethylene glycol diacrylate;

5 parts by weight of benzophenone;

0.6 part by weight of 4,4'-bis(dimethyl amino) benzophenone;

0.1 part by weight of crystal violet;

0.1 part by weight of benzotriazole; and 300 parts by weight of methyl ethyl ketone.

The thus prepared photopolymerizable composition was applied to the surface of a polyethylene terephthalate film having a thickness of 25 μm and dried to form a uniform coating film of photoresist having a thickness of 38 μm. This photoresistcoated polyethylene terephthalate film was applied to a copperfoiled laminated plate to have the photoresist layer contacted with the copper surface polished by buffing and laminated together at 103° C. under a pressure of 2.5 kg/cm².

The photoresist layer was exposed to actinic rays in a dose of 90 mJ/cm² emitted from an extra-high pressure mercury lamp of 3 kW output (Model HMW-201B, manufactured by Oak Co.) through a negative transparency put on the polyethylene terephthalate film, which was then peeled off. The thus pattern-wise exposed photoresist film was developed at 32° C. in a spray developing machine for 80 seconds using a 1.5% by weight aqueous solution of sodium carbonate as the developer solution followed by washing with water and drying to give a patterned photoresist layer.

In the next place, the copper foiled laminated substrate having through-holes was immersed in a copper sulfate-based electrolytic plating bath and electrolytic copper plating was performed on the area not covered by the patterned photoresist layer for 40 minutes at a bath temperature of 60° C. The substrate after this plating treatment was further immersed in a solder plating bath at 25° C. for 15 minutes and plated with the solder alloy.

Separately, an aqueous remover solution was prepared by adding sodium borohydride to a 4% by weight aqueous solution of sodium hydroxide in an equimolar amount to the sodium hydroxide.

The substrate after the solder plating treatment was immersed in the above prepared remover solution kept at 40° C. for 10 minutes. Removal of the patterned photoresist layer was complete absolutely without discoloration or denaturation of the copper and solder surfaces.

The copper surface on the substrate exposed bare by removing the patterned photoresist layer was subjected to a treatment of spray etching for 90 seconds at 40° C. using an alkaline etching solution having a pH of 10 with the patterned solder plating layer as the etching mask followed by washing first with an ammonia water and then with water and drying. The thus obtained pattern of copper wiring was sharply trimmed without incompleteness and still without over-etching.

The substrate was then coated with a solder flux and heated at 120° C. in the pre-heating zone of an infrared-heated fusing apparatus to effect the fluxing treatment followed by increase of the temperature to 240° C. to effect fusing so that the solder plating layer was melted uniformly. The substrate having the patterned copper wiring was cooled to 90° C. and then subjected to a brushing treatment on the surface in a stream of hot water at 50° C. followed by washing with water and drying so that the surface of the solder plating was imparted with luster.

Thereafter, a protecting film was formed on the whole surface of the substrate excepting the areas on and around the through-holes. ICs and other electronic parts were mounted on the substrate and fixed and connected to the copper wiring by soldering to give a completed circuit board which was found to work perfectly by testing.

EXAMPLE 2

A substrate having ICs and other parts mounted thereon was prepared in substantially the same manner as in Example 1 except that the remover solution was a 5% by weight aqueous solution of sodium hydroxide admixed with dimethyl amine borane $(CH_3)_2NH:BH_3$ in an amount of 10 moles per mole of sodium hydrixde. The results were substantially the same as in Example 1.

EXAMPLE 3

A photopolymerizable composition was prepared by uniformly mixing:

100 parts by weight of a copolymer of methyl methacrylate, butyl methacrylate, methacrylic acid and 2methacryloxyethyl terephthalate $(CH_2=C(CH_3)-CO-O-CH_2CH_2-O-CO-(p-C_6H_4)-COOH)$ in a weight ratio of 40:20:10:30 having an average molecular weight of about 50,000;
30 parts by weight of trimethylol propane triacrylate;
5 parts by weight of diethyl thioxnthone;
3 parts by weight of 2,2-dimethoxy-2-phenyl acetophenone;
0.1 part by weight of crystal violet;
0.1 part by weight of benzotriazole; and
300 parts by weight of methyl ethyl ketone.

A patterned photoresist layer was formed on a copper-foiled laminated substrate by using the above prepared photopolymerizable composition and the substrate was subjected to the treatments of electrolytic copper plating and solder plating in the same manner as in Example 1. The subsequent processing of the substrate was undertaken in the same manner as in Example 1 except that the remover solution was a 6% by weight aqueous solution of potassium hydroxide admixed with sodium borohydride $NaBH_4$ and trimethyl amine borane $(CH_3)_3N:BH_3$ each in an amount of 0.5 mole per mole of the potassium hydroxide. The substrate having ICs and other parts mounted thereon was found by testing to work perfectly as in Example 1.

COMPARATIVE EXAMPLE

The procedure was substantially the same as in Example 1 except that the remover solution used for removing the photoresist contained no sodium borohydride to find discoloration on the copper surface and absence of luster on the solder surface after removal of the photoresist layer. Further, it was found by inspecting the surface of the substrate after the etching treatment that the copper wiring was partly exposed bare due to the poor resistance of the solder plating layer against the attack of the etching solution. The fusing treatment at 240° C. undertaken thereafter failed to melt the solder plating layer which was left unmolten retaining the form on the copper wiring.

As is demonstrated by the examples given above, the inventive remover solution for photoresist caused no discoloration or denaturation on the copper and solder surfaces of a copper-foiled laminated substrate after removal of the pattern-wise photoresist layer. The subsequent etching treatment could give a sharply trimmed pattern of copper wiring and the solder surface after the fusing treatment of the substrate had good luster. Thus, it was concluded that the inventive remover solution was quite satisfactory for the manufacture of circuit board substrates.

What is claimed is:

1. A method for removing a patterned photoresist film provided on a substrate for a printed circuit during the manufacture of said printed circuit, consisting essentially of the step of immersing said substrate provided with patterned photoresist film in a remover solution for a time period sufficiently long and at a temperature sufficiently high for removing said patterned photoresist film from said substrate, wherein said photoresist is one which is developable by a weakly alkaline developer solution, said immersion step for removing the patterned photoresist film is carried out when the patterned photoresist film is no longer needed during the manufacture of said printed circuit, and said remover solution comprises:
   (a) a solvent;
   (b) an alkaline compound dissolved in said solvent; and
   (c) a borohydride compound dissolved in said solvent,
   wherein the concentration of said alkaline compound dissolved in the solvent is in the range from 0.1 to 10% by weight, and the amount of said borohydride compound dissolved in the solvent is in the range from 0.01 to 50 moles per mole of the alkaline compound dissolved in the solvent.

2. A method as in claim 1, wherein said solvent is selected from the group consisting of water, alcohols, ethers, ketones, chlorinated hydrocarbons and aromatic hydrocarbons.

3. A method as in claim 2, wherein said solvent is water.

4. A method as in claim 1, wherein said alkaline compound is selected from the group consisting of inorganic alkaline compounds and organic alkaline compounds.

5. A method as in claim 4, wherein said alkaline compound is an inorganic alkaline compound.

6. A method as in claim 5, wherein said inorganic alkaline compound is selected from the group consisting of alkali metal hydroxides, alkali metal carbonates, alkali metal hydrogen carbonates, alkali metal phosphates and alkali metal pyrophosphates.

7. A method as in claim 1, wherein said borohydride compound is selected from the group consisting of sodium borohydride, lithium borohydride, dimethyl amine borane, trimethyl amine borane, pyridine borane, tert-butyl amine borane, triethyl amine borane and morpholine borane.

8. A method as in claim 1, wherein said photoresist coating is formed by using a liquid photoresist composition.

9. A method as in claim 1, wherein said photoresist coating is formed by using a dry film photoresist composition.

10. A method as in claim 1, wherein said substrate is a copper-foiled laminated plate.

* * * * *